US009922973B1

(12) United States Patent
Shank et al.

(10) Patent No.: US 9,922,973 B1
(45) Date of Patent: Mar. 20, 2018

(54) SWITCHES WITH DEEP TRENCH DEPLETION AND ISOLATION STRUCTURES

(71) Applicant: GLOBALFOUNDRIES INC., Grand Cayman (KY)

(72) Inventors: Steven M. Shank, Jericho, VT (US); Anthony K. Stamper, Burlington, VT (US); John J. Ellis-Monaghan, Grand Isle, VT (US); Thai Doan, Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/611,184

(22) Filed: Jun. 1, 2017

(51) Int. Cl.
| | |
|---|---|
| *H01L 21/76* | (2006.01) |
| *H01L 27/088* | (2006.01) |
| *H01L 29/08* | (2006.01) |
| *H01L 29/10* | (2006.01) |
| *H01L 27/02* | (2006.01) |
| *H01L 29/06* | (2006.01) |
| *H01L 21/8234* | (2006.01) |
| *H01L 21/761* | (2006.01) |
| *H01L 21/764* | (2006.01) |
| *H01L 21/02* | (2006.01) |
| *H01L 21/763* | (2006.01) |

(52) U.S. Cl.
CPC .......... *H01L 27/088* (2013.01); *H01L 21/761* (2013.01); *H01L 21/764* (2013.01); *H01L 21/823481* (2013.01); *H01L 27/0207* (2013.01); *H01L 29/0646* (2013.01); *H01L 29/0649* (2013.01); *H01L 29/0847* (2013.01); *H01L 29/1079* (2013.01); *H01L 29/1095* (2013.01); *H01L 21/0262* (2013.01); *H01L 21/02532* (2013.01); *H01L 21/02573* (2013.01); *H01L 21/02595* (2013.01); *H01L 21/763* (2013.01); *H01L 21/823493* (2013.01); *H01L 29/0603* (2013.01)

(58) Field of Classification Search
CPC ........... H01L 21/763; H01L 21/823481; H01L 21/823493; H01L 29/0603
USPC .......................................... 438/294; 257/504
See application file for complete search history.

(56) References Cited

U.S. PATENT DOCUMENTS

| | | | |
|---|---|---|---|
| 7,427,803 B2 | 9/2008 | Chao et al. | |
| 8,445,356 B1 * | 5/2013 | Cai | ................... H01L 21/76232 257/374 |

(Continued)

OTHER PUBLICATIONS

Hashimoto et al., "A Study on Suppressing Crosstalk Through a Thick SOI Substrate and Deep Trench Isolation", IEEE Journal of Electronic Devices Society, Jul. 2013, vol. 1, No. 7, 7 pages.

(Continued)

*Primary Examiner* — George Fourson, III
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to switches with deep trench depletion and isolation structures and methods of manufacture. The structure includes a bulk substrate with a fully depleted region below source and drain regions of at least one gate stack and confined by deep trench isolation structures lined with doped material.

20 Claims, 3 Drawing Sheets

(56) References Cited

U.S. PATENT DOCUMENTS

| | | | |
|---|---|---|---|
| 8,674,413 B1* | 3/2014 | Chi | H01L 27/0924 257/213 |
| 8,674,472 B2 | 3/2014 | Botula et al. | |
| 8,772,117 B2* | 7/2014 | Chi | H01L 29/785 257/E21.09 |
| 9,048,284 B2 | 6/2015 | McPartlin et al. | |
| 2006/0284238 A1* | 12/2006 | Dhaoui | H01L 27/0203 257/315 |
| 2008/0073747 A1 | 3/2008 | Chao et al. | |
| 2012/0292705 A1* | 11/2012 | Cheng | H01L 27/1203 257/351 |
| 2014/0367787 A1* | 12/2014 | Vakada | H01L 27/092 257/369 |
| 2016/0372429 A1* | 12/2016 | Cho | H01L 21/823493 |
| 2016/0372483 A1* | 12/2016 | Cho | H01L 27/1203 |
| 2016/0372592 A1* | 12/2016 | Cho | H01L 29/7816 |

OTHER PUBLICATIONS

Ohguro et al., "High performance digital-analog mixed device on a Si substrate with resistivity beyond 1 kΩ cm", IEEE, Dec. 10-13, 2000, 4 pages.

* cited by examiner

US 9,922,973 B1

SWITCHES WITH DEEP TRENCH DEPLETION AND ISOLATION STRUCTURES

FIELD OF THE INVENTION

The present disclosure relates to semiconductor structures and, more particularly, to switches with deep trench depletion and isolation structures and methods of manufacture.

BACKGROUND

Radio frequency (RF) devices are used in many different types of communication applications. For example, RF devices can be used in cellular telephones with wireless communication components such as switches, MOSFETs, transistors and diodes.

As cellular telephones become more complex and commoditized, there is an increasing need to provide higher performance and lower price points for the wireless communication components. A significant fraction of the cost of manufacturing an RF switch, for example, is the cost to engineer very high linearity such that harmonic distortion is extremely low and meets product specifications.

RF devices are typically manufactured on high resistivity silicon wafers or substrates to achieve the needed rf linearity. State-of-the-art trap rich silicon on insulator (SOI) high resistivity substrates offer excellent vertical isolation and linearity, but can be up to 50% of the total manufacturing cost because they can be quadruple the cost of a high resistivity non-SOI substrate. i.e., a rf device formed on a trap rich SOI wafer could have a total normalized manufacturing cost of 1.0 while a similar device formed on a high resistivity non-SOI bulk wafer could have a total normalized manufacturing cost of 0.6. However, devices built on bulk Si substrates have been known to suffer from degraded linearity, harmonics, noise, and leakage currents, any of which will degrade device performance thus necessitating the higher cost of SOI wafers.

SUMMARY

In an aspect of the disclosure, a structure comprises a bulk substrate with a fully depleted region below source and drain regions of at least one gate stack and confined by deep trench isolation structures lined with doped material.

In an aspect of the disclosure, a structure comprises: a high resistivity bulk substrate having at least one well region; a plurality of radio frequency (RF) devices formed over the at least one well region; a plurality of deep trench isolation structures extending below the at least one well region, the plurality of deep trench isolation structures having an airgap or void lined with doped material; a fully depleted region confined by the plurality of deep trench isolation structures; and a merged depletion region below the fully depleted region.

In an aspect of the disclosure, a method comprises: forming at least one well in a bulk high resistivity substrate; forming a plurality of active devices on the bulk high resistivity substrate and above the at least one well; forming a deep trench structure in the substrate below the at least one well; and lining the deep trench structure with a doped material which pinches off to form an airgap or void.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to switches with deep trench depletion and isolation structures and methods of manufacture. More specifically, the present disclosure relates to radio frequency (RF) switches with deep trench isolation structures used in front end module transceivers. Advantageously, the deep trench isolation structures used with the RF switches improve leakage currents, noise, and linearity (harmonics) for devices built on bulk Si substrates and high resistivity bulk Si substrates. In addition, the structures described herein further reduce standby power.

In embodiments, the deep trench isolation structures surround FET switches and other CMOS devices to provide isolation for depletion regions. In fact, the deep trench isolation structures described herein can be used with any active device with a different substrate bias. For example, the deep trench isolation structures can be used in dual or triple well stack switch FETs with spacing limited by minimum ground rules (e.g., trench CD and overlay). The deep trench isolation structures are different from known trench isolation (TI) structures or shallow trench isolation (STI) structures. By way of example, TI or STI are shallow structures which do not extend beyond the p-well, i.e., 0.5-1.0 micron deep; whereas, the deep trench isolation structures are formed several μm deep, e.g., 5 μm-60 μm deep, which provides isolation from well charges that produce harmonic distortion. For example, the implementation of the deep trench isolation structures described herein can achieve 100× reduction in substrate leakage current, i.e., 1 uA/um to 1 nA/um, while also providing 20 dBm "H2" and 15 dBm "H3" improvement based on 130-180 nm technologies.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1:
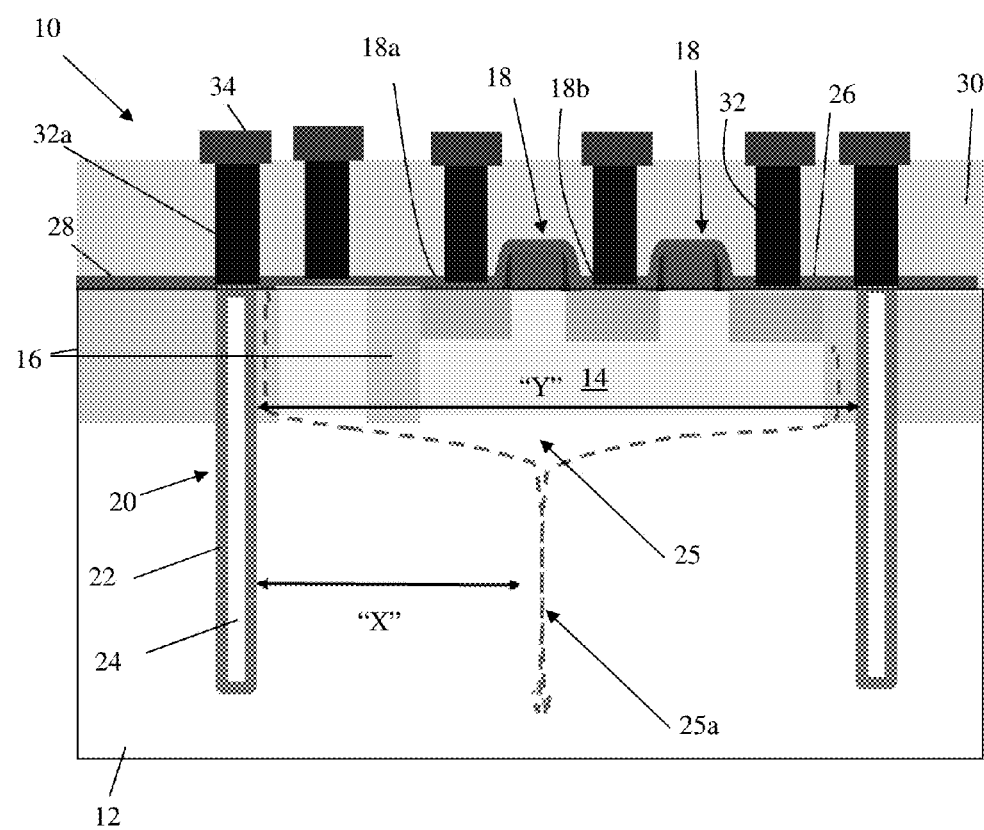
FIG. 1 shows a structure and respective fabrication processes in accordance with aspects of the present disclosure.

FIG. 1 shows a structure and respective fabrication processes in accordance with aspects of the present disclosure. In particular, the structure 10 can be an RF switch FET built on a substrate 12, e.g., P-type substrate. In embodiments, the substrate 12 can be a bulk Si with high resistivity. In embodiments, the high resistivity bulk Si substrate 12 can have a resistivity in the range of about between 1 Kohm-cm to 10 Kohm-cm or greater, as an illustrative example. Higher resistivities can also be contemplated up to 20 Kohm-cm. It should be recognized that resistivities of 10 Kohm-cm are sufficient to significantly reduce substrate induced harmonic distortion. In embodiments, the substrate 12 can be composed of any suitable semiconductor materials such as, e.g., Si, SiGe, SiGeC, SiC, GaAs, InAs, InP, and other III/V or II/VI compound semiconductors.

Still referring to FIG. 1, the substrate 12 includes a p-well region 14. In embodiments, the p-well region 14 can be formed by any conventional ion implantation or diffusion process using, e.g., boron, to attain a suitable well depth and doping profile. A plurality of shallow trench isolation (STI) structures 16 are formed in the substrate 12 extending through the p-well region 14 and between transistors 18. In embodiments, the STI structures 16 can be composed of oxide material, as an example. The STI structures 16 can be formed by using conventional lithography, etching and deposition steps, followed by a chemical mechanical polishing (CMP) step. In preferred embodiments, the STI structures 16 create a collar surrounding the transistors 18, and extend below the p-well region 14 to prevent breakdown in the p-well region 14. By way of example, the depth of the STI structures 16 can be about 0.5 µm to about 10 µm.

FIG. 1 further shows deep trench isolation structures 20 formed through the p-well regions 14 and surrounding the transistors 18. In embodiments, the deep trench isolation structures 20 can be formed through the STI structures 16 and preferably beyond a depth of the p-well region 14. The deep trench isolation structures 20 can be spaced apart by a predetermined distance "Y". In embodiments, the predetermined distance "Y" can be about 10 µm to 15 µm; although other dimensions are contemplated herein. The deep trench isolation structures 20 isolate the p-well regions 14 from adjacent well regions, e.g., n-well and p-well regions. Accordingly, by providing the deep trench isolation structures 20 it is now possible to reduce harmonics, improve leakage currents, and reduce noise on high resistivity bulk substrates.

The deep trench isolation structures 20 can be formed prior to or after the formation of the STI structures 16, using conventional lithography and etching processes followed by a deposition lining process. For example, a resist can be formed over the substrate 12 and exposed to energy (light) to form a pattern (opening). A RIE process with selective chemistries can be used to form a deep trench in the substrate 12. A depth of the deep trench can be below the p-well region 14 and, more preferably, can be 30 µm or greater, e.g., about 30 µm to about 100 µm and more preferably about 30 µm to about 50 µm in depth. In further embodiments, the deep trench isolation structures 20 can be formed to a backside grind interface of the bulk substrate 12 to completely isolate adjacent well regions and the RF devices from DC substrate currents. The diameter or width of the deep trench can be about 1 µm; although other dimensions are also contemplated herein depending on the technology node, amongst other factors. The resist can be removed by conventional stripants or oxygen ashing processes.

As further shown in FIG. 1, the deep trench can be lined with a polysilicon material 22 and, more specifically, a doped polysilicon material 22 to form the deep trench isolation structure 20. In embodiments, the dopant can be an n-type dopant, e.g., arsenic or phosphorous, or a p-type dopant, e.g., boron. In embodiments, the doped polysilicon material 22 can be deposited to a thickness of about 0.25 µm on the sidewalls of the deep trench isolation structure 20.

The doped polysilicon material 22 can be doped through an in-situ process or, alternatively, can be composed of a dual or multi layer liner comprising alternating layers of intrinsic (undoped) polysilicon material followed by doped polysilicon material. In this latter scenario, the intrinsic (undoped) polysilicon material can be formed directly on the sidewall of the deep trench isolation structure 20 to prevent dopant diffusion into the substrate 12. In embodiments, the doped polysilicon material 22 can be deposited using any conventional chemical vapor deposition (CVD) process including, e.g., a low pressure chemical vapor deposition (LPCVD) process or a rapid thermal chemical vapor deposition (RTCVD) process. In any deposition process, an airgap or void 24 is created within the deep trench isolation structure 20 by a "pinch off" of the doped polysilicon material 22 at the top of the deep trench isolation structure 20. In this way, the doped material 22 will form or encapsulate an airgap or void 24 which provides a decreased capacitance of the deep trench isolation structure 20.

FIG. 1 further shows a fully depleted silicon region 25 confined by the deep trench isolation structures 20. In embodiments, the fully depleted region 25 is under and in contact with the bottom of the source/drain diffusions (e.g., source regions 18a and drain regions 18b) and channel region. A merged depletion region 25a is created across the width of the switch (e.g., transistors 18) by applying a bias to the doped polysilicon material 22. In embodiments, the bias or voltage can be applied to contacts 32a in direct electrical contact with the doped polysilicon material 22. In embodiments, the bias on the doped polysilicon material 22 can be −3.3V, as an example; although other biases can be applied depending on the bandgap voltage, dopant concentration of the doped polysilicon material 22, amongst other factors. In embodiments, at −3.3 V, the merged depletion region 25a can be about 5 µm to 8 µm away from a sidewall of the deep trench isolation structures 20, as represented by "X".

It has been found that the merged depletion region across the width of the switch (e.g., transistors 18) reduces standby power by 100× (compared to conventional structures) while the body is biased. This is accomplished by reducing substrate current from uA's to nA's. Also, the merged depletion region 25a is not geometry dependent, with the depletion depth being independent of device bias voltage. In addition, non-linear capacitance is reduced and linearity improved due to large area depletion regions compared to triple well junction devices. Moreover, as should be understood by those of skill in the art, the source/drain junction depletion depth into the substrate 12 will oscillate with the on/off cycles of the switch, e.g., transistors 18, while the depletion of the deep trench isolation structures 20 remains fixed.

Referring still to FIG. 1, in embodiments, the transistors 18 can be active RF devices, e.g., RF switches, or other active or passive devices. The transistors 18 can be formed using multiple gates in an array of alternating source/drain/source/drain/, etc. configuration, as is known in the art. In embodiments, the spacing between the stacks, e.g., transistors, can be less than 2 µm; although other dimensions are contemplated depending on the technology node. As should also be understood by those of ordinary skill in the art, the transistors 18 can be formed by conventional CMOS processes including deposition of gate dielectrics (e.g., high-k dielectrics such as Hafnium oxide, etc.), followed by gate metals (e.g., different work function metals), patterning of the materials using lithography and etching (e.g., reactive ion etching (RIE) to form the gate stacks, followed by sidewall formation, e.g., oxide or nitride materials deposited on the gate stacks). Source regions 18a and drain regions 18b are formed within the substrate 12 or on the substrate 12 (e.g., for raised source and drain regions) using conventional dopant or ion implantation processes such that no further explanation is required. In embodiments, an epitaxial growth process can be used to form raised source and drain regions.

As further shown in FIG. 1, silicide contacts 26 are formed on the source regions 18a and drain regions 18b and, if required, over the deep trench isolation structure 20. In embodiments, the silicide process begins with deposition of a thin transition metal layer, e.g., nickel, cobalt or titanium, over fully formed and patterned semiconductor devices (e.g., doped or ion implanted source and drain regions 18a, 18b and respective devices 18). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts 26 in the active regions of the devices, e.g., transistors 18. A barrier layer 28 can be formed over the silicide contacts 26 in the active regions of the devices, e.g., transistors 18. The barrier layer 28 can be a barrier nitride film deposited using a conventional deposition process, e.g., CVD process.

An interlevel dielectric material 30 can be formed over the exposed surfaces of the structure, e.g., over the transistors 18 and barrier layer 28. The interlevel dielectric material 30 can be an oxide material deposited using any conventional deposition process, e.g., CVD. Contacts 32, 32a are formed within the interlevel dielectric material 30 using conventional lithography, etching and deposition of metal or metal alloy processes. The contacts 32 will be in direct electrical contact with the silicide contacts 26; whereas, the contacts 32a are in direct electrical contact with the doped polysilicon material 22 of the deep trench isolation structure 20 (in embodiments through silicide regions). In alternate embodiments, a resistor (e.g., polysilicon, diffusion, etc.) can be tied to the deep trench isolation structures 20, which will bias the deep trench isolation structure 20 (e.g., doped material of the deep trench isolation structure 20) through the resistor to improve breakdown. The resistor is also reflected at reference numeral 26. In additional embodiments, a JFET depletion region can act as a triple well without the added parasitic. Wiring layers and other back end of the line structures 34 are formed in contact with the contacts 32, 32a using, again, conventional CMOS deposition and patterning processes.

Figure 2:
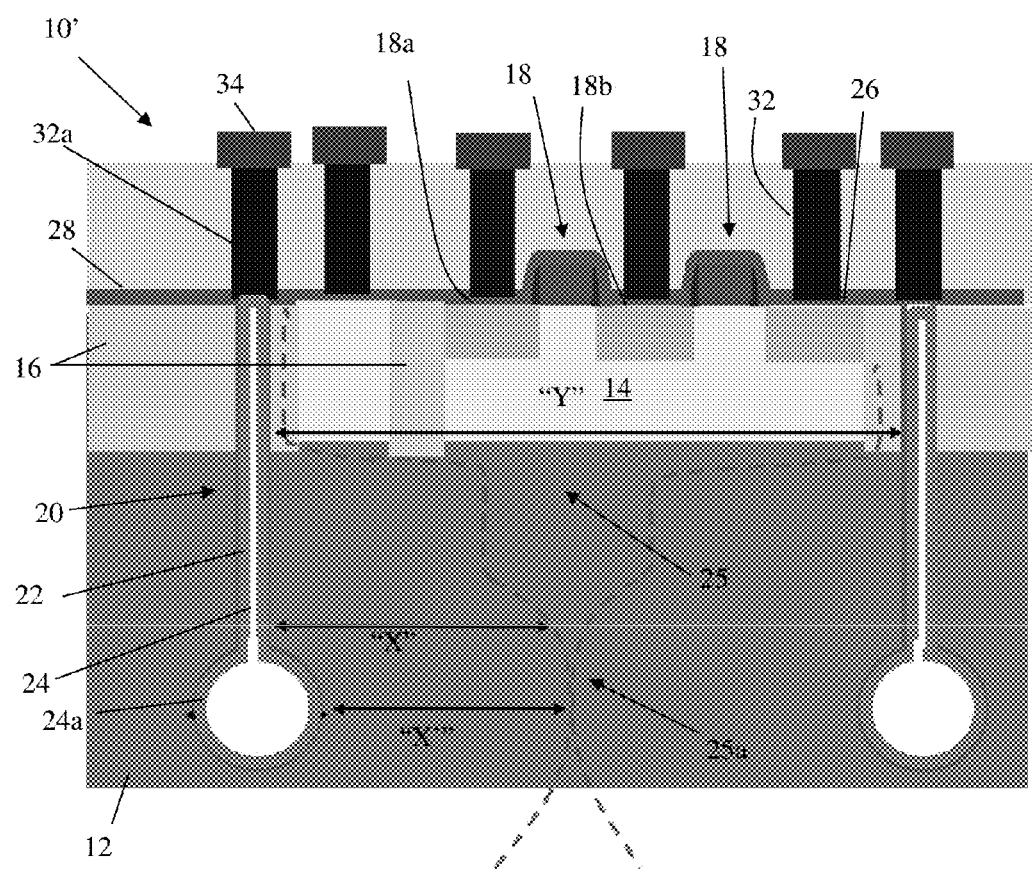
FIG. 2 shows a structure and respective fabrication processes in accordance with additional aspects of the present disclosure.

FIG. 2 shows a structure and respective fabrication processes in accordance with additional aspects of the present disclosure. More specifically, the structure 10' shown in FIG. 2 includes the structures and materials described in FIG. 1, in addition to a spherical-shaped lined airgap or void 24a extending from a bottom of the deep trench isolation structure 20. In embodiments, the spherical-shaped lined airgap or void 24a can expand the depletion region 25 and facilitate merging 25a under the p-well 14.

In embodiments, the deep trench isolation structure 20 and spherical-shaped lined airgap or void 24a can be lined with a polysilicon material 22 and, more specifically, a doped polysilicon material 22. In embodiments, the dopant can be an n-type dopant, e.g., arsenic or phosphorous, or a p-type dopant, e.g., boron. In further embodiments, the doped polysilicon material 22 can be deposited to a thickness of about 0.25 μm on the sidewalls of the deep trench isolation structure 20 and the spherical-shaped lined airgap or void 24a.

In embodiments, the spherical-shaped lined airgap or void 24a can be formed by conventional lithography and etching processes. By way of example, after formation of the deep trench isolation structure 20, a thermal oxide material (TEOS) or CVD oxide can be deposited within the deep trench isolation structures 20 to line the bottom and sidewalls thereof. The lined deep trench isolation structures 20 then undergo an anisotropic etching process to remove the oxide material from the bottom surface of the deep trench isolation structure 20, e.g., to expose the substrate 12. Following the anisotropic etching process, an isotropic etching process is performed to etch the exposed substrate 12 to form the spherical-shaped airgap or void 24a. The spherical-shaped airgap or void 24a and the deep trench isolation structures 20 can then be lined with doped polysilicon material 22. In embodiments, the spherical-shaped airgap or void 24a can have a circumference of about 6 μm.

As described with respect to the structure 10 of FIG. 1, the merged depletion region 25a is created across the width of the switch (e.g., transistors 18) by applying a bias to the doped polysilicon material 22. In embodiments, the merged depletion region 25a can be about 5 μm to 8 μm away from a sidewall of the deep trench isolation structure 20, as represented by "X" and about 2 μm to 5 μm away from a sidewall of the spherical-shaped lined airgap or void 24a, as represented by "X".

As previously described, the doped polysilicon material 22 can be doped through an in-situ process or, alternatively, can be composed of a dual or multi-layer liner of alternating layers of intrinsic (undoped) polysilicon material followed by doped polysilicon material over the remaining oxide liner on the sidewalls of the deep trench isolation structures 20, as also represented by reference numeral 22. The intrinsic (undoped) polysilicon material and/or oxide material will prevent dopant diffusion into the substrate 12. The doped polysilicon material 22 can be deposited using any conventional chemical vapor deposition (CVD) process, e.g., LPCVD, RTCVD, etc.

Figure 3:
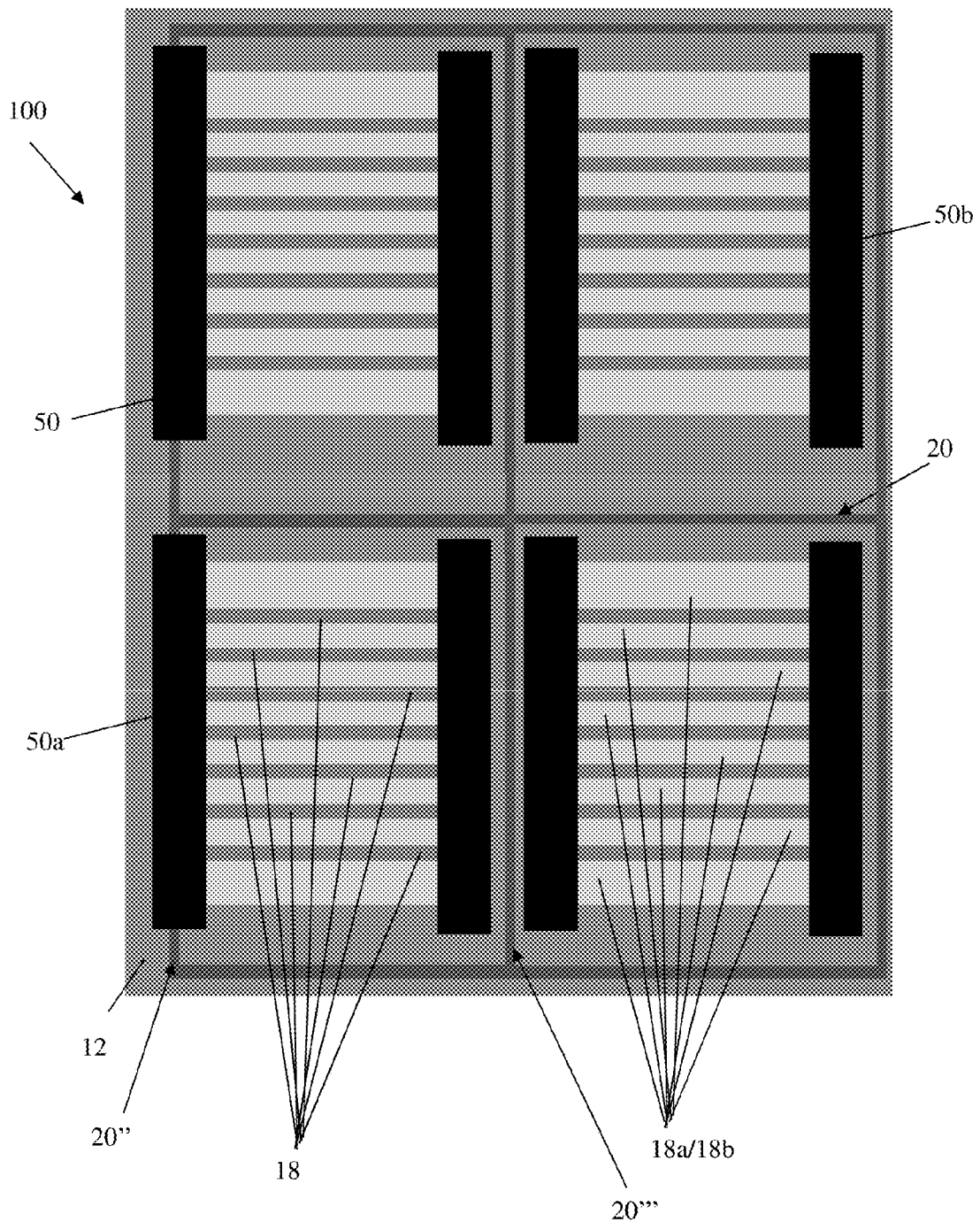
FIG. 3 shows a layout view of the structures of FIGS. 1-2 in accordance with aspects of the present disclosure.

FIG. 3 shows a top view layout view of the structures of FIGS. 1 and 2 in accordance with aspects of the present disclosure. More specifically, the layout view 100 shows a plurality of transistors 18, e.g., RF switches or other FETs, aligned in parallel. Source and drain regions 18a, 18b are provided between the plurality of transistors 18. A common gate 50 is shown connected to each of the plurality of transistors 18. In embodiments, the common gate 50 can be a poly gate, for example. Deep trench isolation structures 20 can be provided underneath and/or on a side of the common gate 50 or any combination thereof. For example, the deep trench isolation structures 20" can be underneath the common gate 50a and the deep trench isolation structures 20''' can be on a side of the common gate 50b. It should further be understood that multiple layouts shown in FIG. 3 can be provided, with a deep trench isolation structures 28 shared amongst upper and lower of the plurality of transistors 18.

In comparison to the structures described herein, high resistivity Si wafer applications provide improved linearity by reducing substrate carrier induced harmonics; however, high resistivity depletion regions can extend 5 μm to 100 μm deep or more into the substrate, resulting in leakage between neighboring devices and harmonic distortion. Triple wells block depletion regions from merging, i.e., depletion regions of neighboring p-wells and prevents DC substrate current from interacting with p-well region and FET. However, merged triple well depletion regions can result in harmonic distortion due to the coupling between the well regions, add parasitic capacitance, which degrades NFET switch electrical properties such as off capacitance (Coff), and adds cost. Triple well regions also result in additional electrical junctions that add non-linear capacitances that further increase harmonic distortion. These issues are now addressed and solved at a lower cost by implementing the structures and methods described herein. Note that, although the description is shown referring to switches, any active or passive device formed on high resistivity substrates could use the fabrication processes and result in structures described herein to improve device isolation and linearity.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a bulk substrate with a fully depleted region below source and drain regions of at least one gate stack and confined by deep trench isolation structures lined with doped material.

2. The structure of claim 1, wherein the bulk substrate is a high resistivity bulk substrate with resistivity of greater than or equal to about 10 Kohm-cm.

3. The structure of claim 1, wherein the fully depleted region touches a bottom of the source and drain regions.

4. The structure of claim 1, wherein a spacing between gate stacks is less than 2 µm.

5. The structure of claim 1, wherein the doped material is an n-type doped polysilicon material or p-type doped polysilicon material on a sidewall of the deep trench isolation structures.

6. The structure of claim 5, further comprising undoped material underneath the doped material and on the sidewall of the deep trench isolation structure.

7. The structure of claim 1, wherein the deep trench isolation structures include an air gap or void.

8. The structure of claim 1, wherein the deep trench isolation structures have a depth greater than a well region formed in the bulk substrate below the source and drain regions.

9. The structure of claim 8, further comprising a merged depletion region between the deep trench isolation structures and below the well region.

10. The structure of claim 1, wherein the deep trench isolation structures isolate radio frequency switches formed on the well region.

11. The structure of claim 1, wherein the deep trench isolation structures include a spherical-shaped airgap or void lined with the doped material and the deep trench isolation structures are lined with an oxide material underneath the doped material.

12. The structure of claim 1, further comprising contacts which provide an electrical bias to the doped material.

13. A structure comprising:
a high resistivity bulk substrate having at least one well region;
a plurality of radio frequency (RF) devices formed over the at least one well region;
a plurality of deep trench isolation structures extending below the at least one well region, the plurality of deep trench isolation structures having an airgap or void lined with doped material;
a fully depleted region confined by the plurality of deep trench isolation structures; and
a merged depletion region below the fully depleted region.

14. The structure of claim 13, wherein the plurality of deep trench isolation structures isolate radio frequency switches formed on the at least one well region.

15. The structure of claim 13, wherein the plurality of deep trench isolation structures include a spherical-shaped airgap or void lined with the doped material and the deep trench isolation structures are lined with an oxide material underneath the doped material.

16. The structure of claim 13, wherein the doped material can be a dual layer or multi layer with doped polysilicon and undoped polysilicon.

17. The structure of claim 13, further comprising contacts which provide an electrical bias to the doped material.

18. The structure of claim 13, wherein the deep trench isolation structure is formed to a backside grind interface of the bulk substrate to completely isolate adjacent well regions and the RF devices from DC substrate currents.

19. A method comprising:
forming at least one well in a bulk high resistivity substrate;
forming a plurality of active devices on the bulk high resistivity substrate and above the at least one well;
forming a deep trench structure in the substrate below the at least one well; and
lining the deep trench structure with a doped material which pinches off to form an airgap or void.

20. The method of claim 19, further comprising forming a spherical-shaped airgap or void lined with the doped material extending from the deep trench structure.

* * * * *